(12) United States Patent
Yun et al.

(10) Patent No.: US 9,041,253 B2
(45) Date of Patent: May 26, 2015

(54) DIRECT FEEDING APPARATUS FOR IMPEDANCE MATCHING OF WIRELESS POWER TRANSMISSION DEVICE, AND TRANSMITTER AND RECEIVER USING THE SAME

(75) Inventors: Je-Hoon Yun, Daejeon (KR); In-Kui Cho, Daejeon (KR); Jung-Ick Moon, Daejeon (KR); Seong-Min Kim, Daejeon (KR); Dong-Hee Park, Chungbuk (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 749 days.

(21) Appl. No.: 13/304,550

(22) Filed: Nov. 25, 2011

(65) Prior Publication Data
US 2012/0133214 A1 May 31, 2012

(30) Foreign Application Priority Data
Nov. 26, 2010 (KR) .................. 10-2010-0118764

(51) Int. Cl.
| H01F 27/42 | (2006.01) |
| H01F 37/00 | (2006.01) |
| H01F 38/00 | (2006.01) |
| H03H 3/00 | (2006.01) |
| H01F 38/14 | (2006.01) |

(52) U.S. Cl.
CPC . *H03H 3/00* (2013.01); *H01F 38/14* (2013.01)

(58) Field of Classification Search
CPC ........... H02J 5/005; H02J 7/025; H02J 17/00; H01F 38/14; B60L 11/182
USPC .......... 307/104, 66, 80, 82, 29; 320/108, 109; 463/37, 43, 39; 343/702, 893
See application file for complete search history.

(56) References Cited

U.S. PATENT DOCUMENTS

| 7,896,742 B2 * | 3/2011 | Weston et al. .................. 463/37 |
| 2009/0284083 A1 | 11/2009 | Karalis et al. |
| 2010/0148589 A1 * | 6/2010 | Hamam et al. ................ 307/104 |
| 2012/0068893 A1 * | 3/2012 | Guterman et al. ............ 343/702 |
| 2012/0153893 A1 * | 6/2012 | Schatz et al. .................. 320/108 |

FOREIGN PATENT DOCUMENTS

| KR | 2009-0006263 A | 1/2009 |
| KR | 2009-0131746 A | 12/2009 |
| KR | 2010-0026075 A | 3/2010 |

OTHER PUBLICATIONS

Qiaowei Yuan et al., "Numerical Analysis on Transmission Efficiency of Evanescent Resonant Coupling Wireless Power Transfer System", IEEE Transactions on Antennas and Propagation, vol. 58, No. 5, pp. 1751-1758, May 5, 2010.

* cited by examiner

*Primary Examiner* — Rexford Barnie
*Assistant Examiner* — Jagdeep Dhillon
(74) *Attorney, Agent, or Firm* — Rabin & Berdo, P.C.

(57) ABSTRACT

A direct feeding apparatus for impedance matching of a wireless power transmission device includes a helical type resonator, and a feeding unit configured to directly feed power to a region having a relatively small current value as compared to a center of a conductive line of the resonator.

17 Claims, 19 Drawing Sheets

Feeding point

Feeding point

Feeding point

Feeding point

Feeding point

Feeding point

DIRECT FEEDING APPARATUS FOR IMPEDANCE MATCHING OF WIRELESS POWER TRANSMISSION DEVICE, AND TRANSMITTER AND RECEIVER USING THE SAME

CROSS-REFERENCE TO RELATED APPLICATIONS

The present application claims priority of Korean Patent Application No. 10-2010-0118764, filed on Nov. 26, 2010, which is incorporated herein by reference in its entirety.

BACKGROUND OF THE INVENTION

1. Field of the Invention

Exemplary embodiments of the present invention relate to wireless power transmission technology; and, more particularly, to an apparatus for feeding power to a resonator, without separate impedance matching, and a transmitter and receiver using the same.

2. Description of Related Art

A conventional RF energy transmission technology using a self resonator having a nonradiative characteristic may be categorized into "symmetric resonance type wireless power transmission technology" and "asymmetric resonance type wireless power transmission technology." The symmetric resonance type wireless power transmission technology uses a resonator to make both of a transmitting resonator and a receiving resonator at the same frequency. The asymmetric resonance type wireless power transmission technology uses a resonator at one side and a non-resonator at another side. As an example of a symmetric resonance type wireless power transmission scheme, both of a transmitting resonator and a receiving resonator using an indirect feeding method are configured with three-dimensional helical type loop resonators, as illustrated in FIG. 1. As an example of an asymmetric resonance type wireless power transmission scheme, a receiving resonator using an indirect feeding method is used as a receiving device, and a three-dimensional helical type loop resonator using a direct feeding method is used as a transmitting device, as illustrated in FIG. 2.

Referring to FIG. 1, in the case of the symmetric resonance type wireless power transmission scheme, impedance matching in a transmitting resonator and a receiving resonator is achieved by adjusting a gap G between a feeding loop line and a helical type resonator. Thus, it is inconvenient in real application and an additional mounting space is required as much as the gap G between the feeding loop line and the helical type resonator.

Referring to FIG. 2, in the case of the asymmetric resonance type wireless power transmission scheme, a receiving unit has the same configuration as that in the symmetric resonance type wireless power transmission scheme. That is, the receiving unit requires a reception impedance matching circuit for adjusting a gap between a feeding loop line and a receiving resonator. Thus, it is inconvenient in real application and an additional mounting space is required as much as the gap between the feeding loop line and the receiving resonator. In terms of input impedance as illustrated in FIG. 3, a resistance and a reactance of a transmitting loop resonator are maintained at approximately 20Ω and approximately −50Ω, respectively, even though a transmitting unit performs a direct feeding. Thus, it is difficult to use a 50-Ω cable which has been widely used, and a separate transmission impedance matching circuit is required. The use of the impedance matching circuit lowers power transmission efficiency as much. In other words, since the asymmetric resonance type wireless power transmission scheme requires a separate matching circuit for maintaining the impedance matching, the power transmission efficiency thereof is lowered. In addition, since the impedance matching is achieved by adjusting the gap from the resonator, it is inconvenient in real application, and an additional mounting area is required as much as the gap. Moreover, it is difficult to manufacture a resonator in an embedded PCB type or a film type which can maintain a miniaturization.

SUMMARY OF THE INVENTION

Since a conventional art has a complexity in terms of implementation for impedance matching and requires a large mounting space, it is difficult to apply to portable devices, such as mobile phones or flash memories. Even though it is installed in large-sized devices, such as TVs or vehicles, both of a transmitting device and a receiving device have a complex structure and a large size, and thus, it is difficult to use them. Accordingly, the present invention has been made to solve the above-mentioned problems.

An embodiment of the present invention is directed to a direct feeding apparatus which requires a small space and easily achieves impedance matching, without separate impedance matching in a resonator, a transmitter and receiver using the same.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a direct feeding apparatus for impedance matching of a wireless power transmission device includes: a helical type resonator; and a feeding unit configured to directly feed power to a region having a relatively small current value as compared to a center of a conductive line of the resonator.

DESCRIPTION OF SPECIFIC EMBODIMENTS

Figure 1:
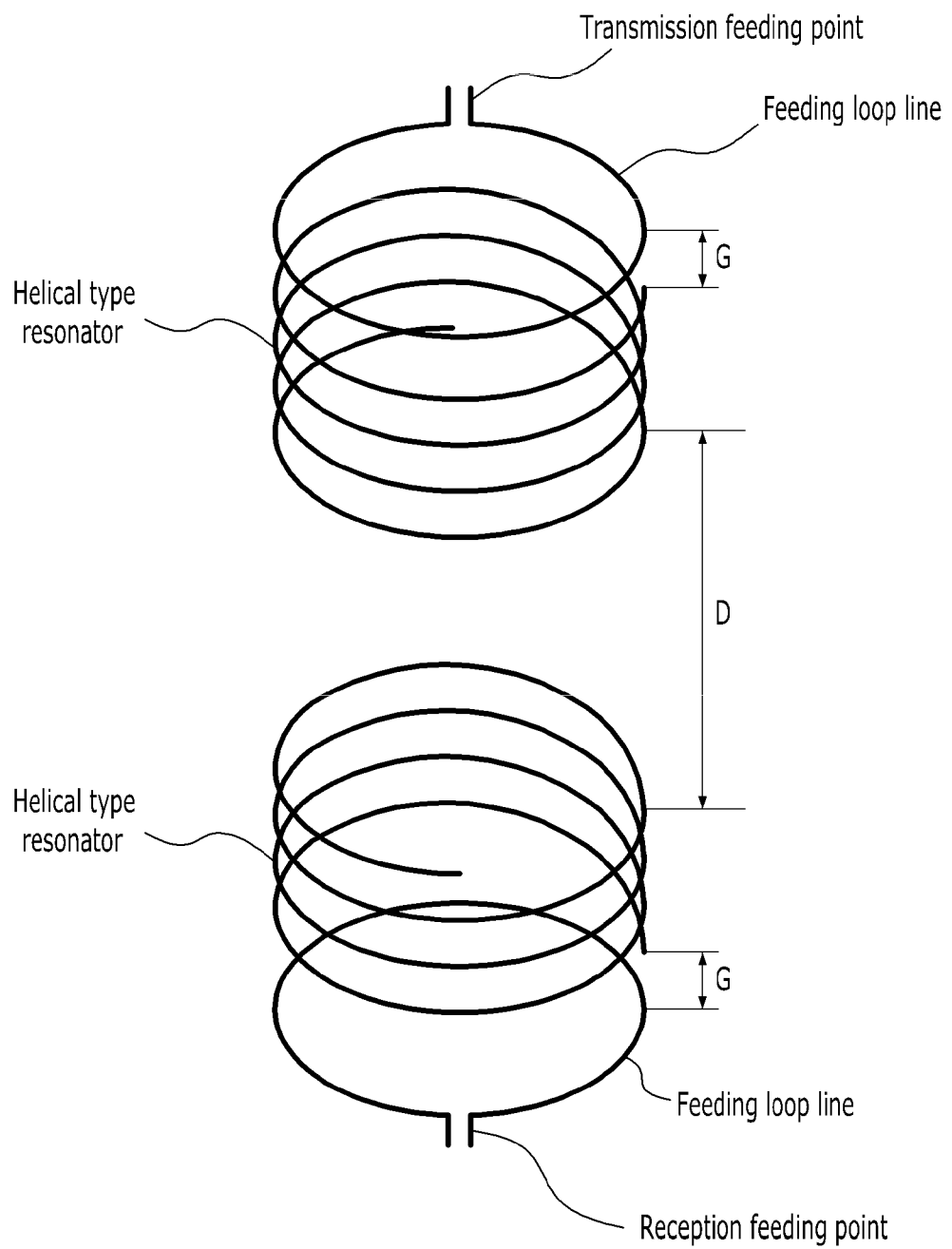
FIG. 1 is a configuration diagram of a transmitting device and a receiving device in a symmetric resonance type wireless power transmission scheme.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
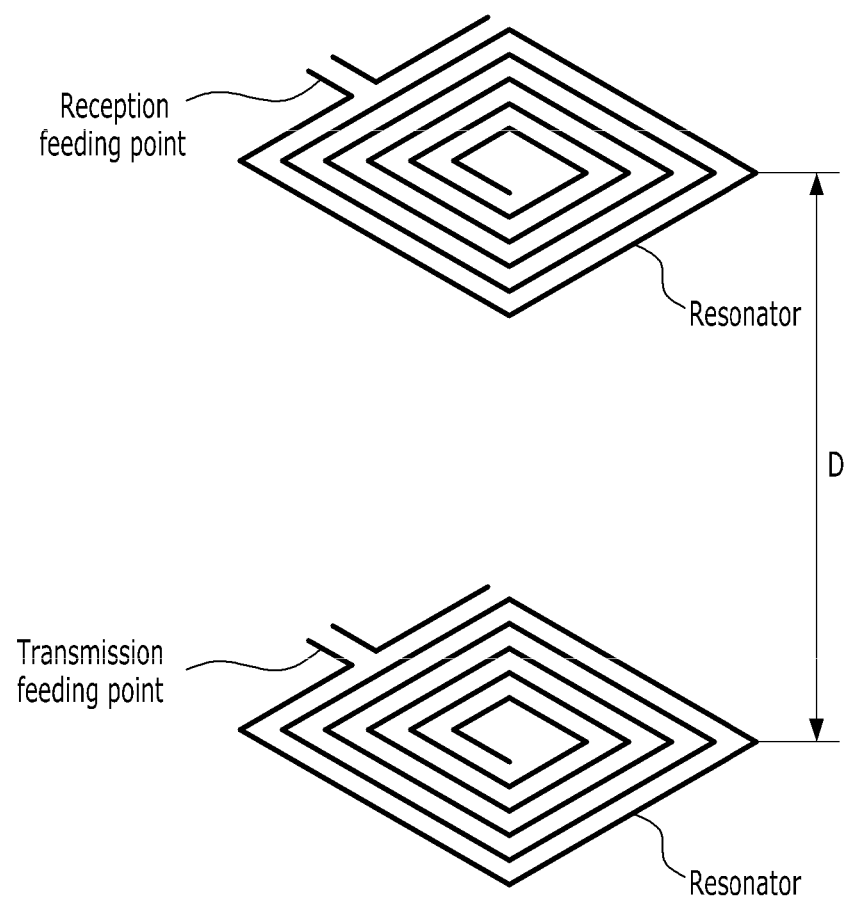
FIG. 4 is a configuration diagram of a direct feeding apparatus and a symmetric resonance type transmitter and receiver using the same in accordance with an embodiment of the present invention.

FIG. 4 is a configuration diagram of a direct feeding apparatus and a symmetric resonance type transmitter and receiver using the same in accordance with an embodiment of the present invention.

A direct feeding apparatus for impedance matching of a wireless power transmission device in accordance with an embodiment of the present invention includes a helical type resonator and a feeding unit (feeding point) configured to directly feed power to a region having a relatively small current value as compared to the center of a conductive line of a resonator. In one embodiment, when the conductive line of the resonator is equally divided by four, the region may be a region which does not include a center of the conductive line.

Figure 5A:
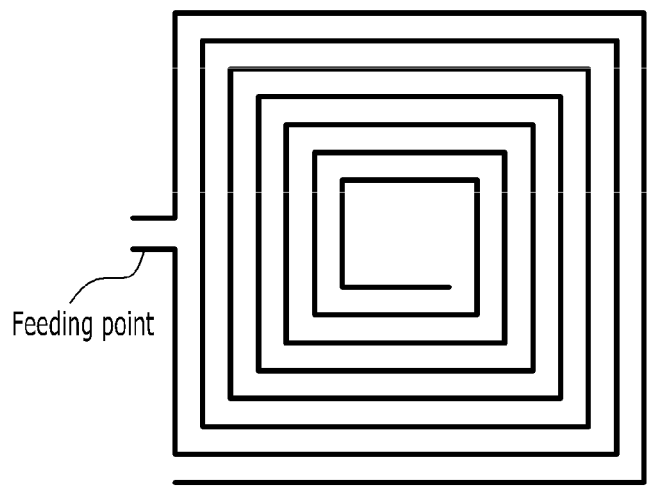
FIGS. 5A and 5B illustrate a method of directly feeding power to a rectangular helical type resonator.
Figure 5B:
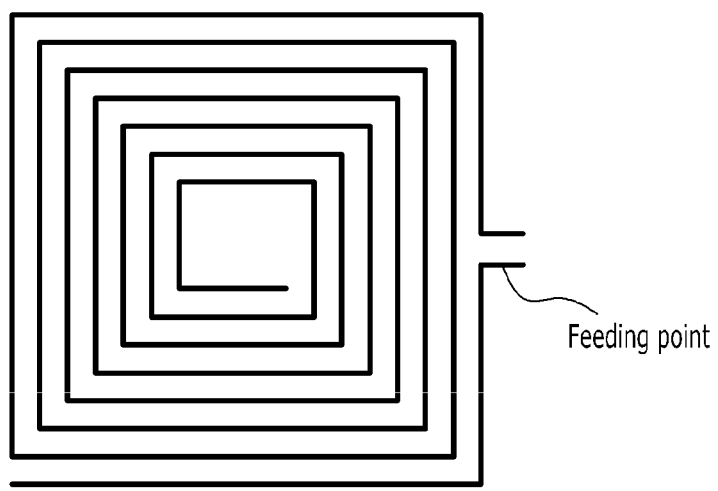

In one embodiment, the direct feeding apparatus directly feeds power to the helical type region (for example, the outside of the resonator) and can be applied to a symmetric or asymmetric resonance type transmitting device or receiving device (transceiver). In the symmetric resonance type transmitting device and receiving device to which the present invention is applied, both of a transmitting resonator and a receiving resonator using the direct feeding method are two-dimensional right-angled (rectangular) helical type resonators. At this time, as illustrated in FIG. 5A or 5B, transmission and reception feeding points are located outside the center. In addition, an asymmetric resonance type transmitting device and receiving device to which the present invention is applied, one of a transmitting resonator and a receiving resonator using the direct feeding method is a two-dimensional right-angled helical type resonator, and the other is a non-resonator. At this time, as illustrated in FIG. 5A or 5B, a transmission or reception feeding point of one of the two resonators is located outside the center of the resonator.

Figure 6A:
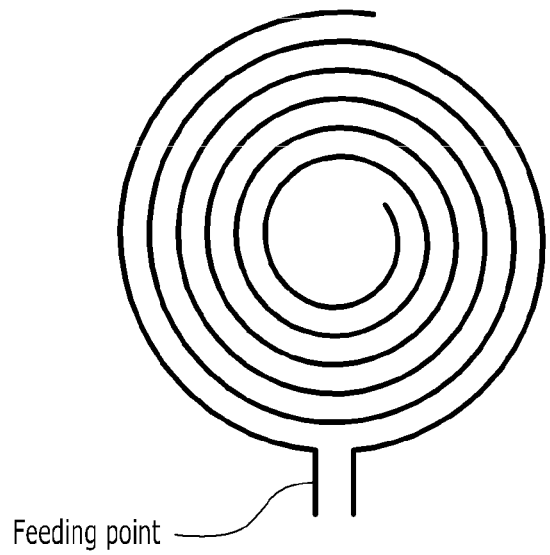
FIGS. 6A and 6B illustrate a method of directly feeding power to a circular helical type resonator.
Figure 6B:
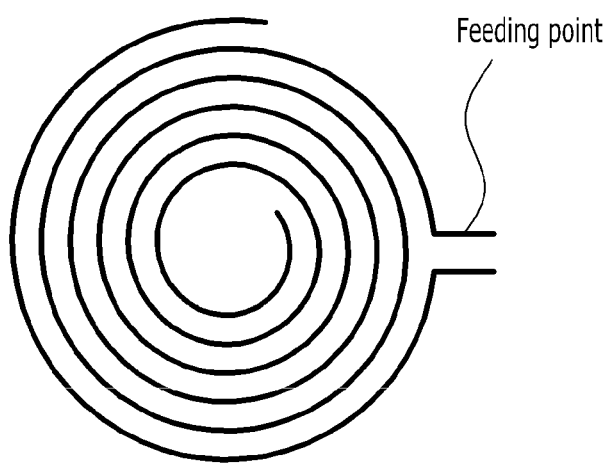

In another embodiment, the direct feeding apparatus directly feeds power to the outside of a circular helical type resonator and can be applied to a symmetric or asymmetric resonance type transmitting device or receiving device (transceiver). In the symmetric resonance type transmitting device and receiving device to which the present invention is applied, both of a transmitting resonator and a receiving resonator using the direct feeding method are two-dimensional circular helical type resonators. At this time, as illustrated in FIG. 6A or 6B, transmission and reception feeding points are located outside the center. In addition, an asymmetric resonance type transmitting device and receiving device to which the present invention is applied, one of a transmitting resonator and a receiving resonator using the direct feeding method is a two-dimensional circular helical type resonator, and the other is a non-resonator. At this time, as illustrated in FIG. 6A or 6B, a transmission or reception feeding point of one of the two resonators is located outside the center of the resonator.

Figure 2:
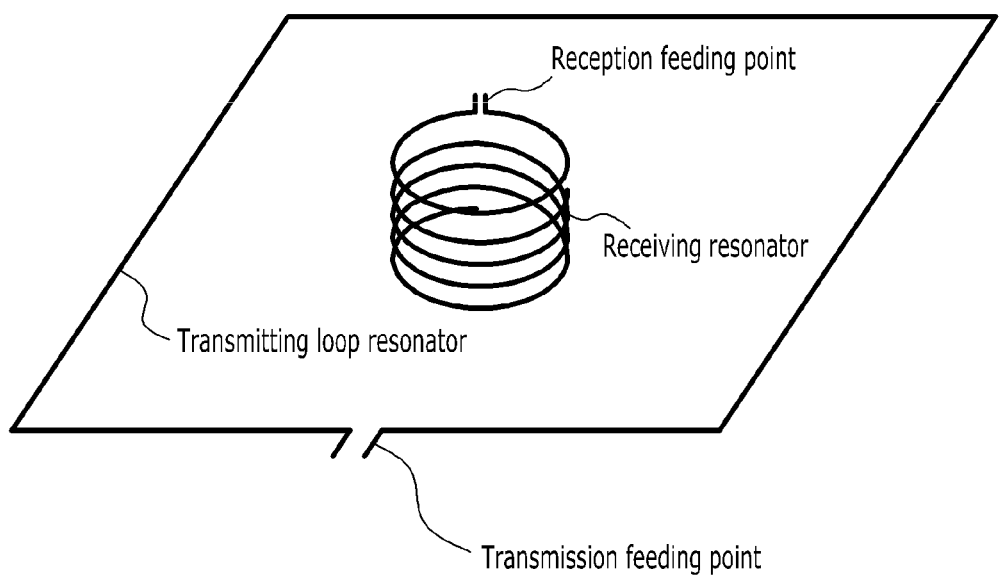
FIG. 2 is a configuration diagram of a transmitting device and a receiving device in an asymmetric resonance type wireless power transmission scheme.
Figure 3:
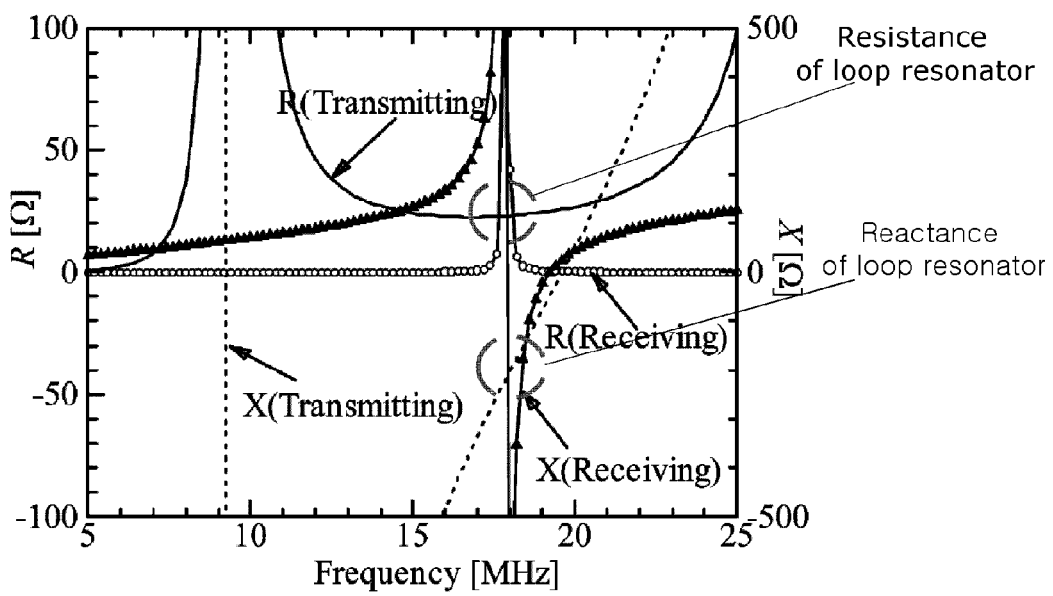
FIG. 3 is a graph showing an input impedance of a transmitting loop resonator of FIG. 2.

Referring again to FIG. 4, the direct feeding apparatus in accordance with the embodiment of the present invention feeds power to not the center of the conductive line of the resonator but a position spaced far apart from the center thereof. For example, the power may be directly fed to the outside spaced apart from the center of the two-dimensional rectangular type helical resonator. As such, in the case of directly feeding the power to the outside of the resonator spaced apart from the center of the two-dimensional rectangular helical type resonator, a transmission or reception impedance matching is not required for adjusting a gap from a feeding loop line (an element necessary for the transmitting device and the receiving device in the symmetric and asymmetric resonance type wireless power transmission schemes of FIGS. 1 and 2). Even in the case of feeding the power through a coaxial cable having an impedance of 50Ω, it is unnecessary to install a separate impedance matching circuit. As the feeding point is installed to be closer to the end point of the conductive line of the helical type resonator, the impedance matching effect is further increased. Therefore, the feeding point is installed in consideration of the impedance matching according to a distance (D in FIG. 4) between the transmitting device and the receiving device. In one embodiment, in order to increase the impedance matching effect as the distance between the transmitting device and the receiving device is farther (that is, as the distance is larger than a threshold value), the feeding point is installed to be closer to the end point of the conductive line of the helical type resonator (that is, the feeding point is installed in a region far from the center). Since the impedance matching effect need not be great as the distance between the transmitting device and the receiving device is closer (that is, as the distance is smaller than the threshold value), the feeding point may be installed in a position far from the end point of the conductive line of the helical type resonator. In this case, when the conductive line of the resonator is equally divided by four, the feeding point may be installed in a region which does not include the center thereof.

The impedance matching effect according to the feeding point will be described below in more detailed. In the case of a resonator having very low far-field radiance, a current value becomes very large at the center due to the resonance. Therefore, when the feeding position is set to the center, an input impedance value greatly decreases. In general, when a 50-Ω coaxial cable is used, impedance matching may not be maintained. This problem may be solved by applying a principle that the input impedance looking into the resonator is relatively increased if power is fed at a position having a small current value. A current distribution similar to a sinusoidal wave is formed at the conductive line of the resonator. Thus, if the feeding point is selected by moving the region having a low current to the end point of the conductive line of the resonator spaced far from the center, the current intensity is lowered and the input impedance is increased. Accordingly, the principle of the impedance matching is applied. In addition, in the case in which the total length of the resonator is equally divided by four, the impedance matching can be effectively achieved by applying the above-mentioned principle when the feeding point is selected in the region which does not include the center and is spaced far from the center.

FIG. 4 illustrates the transmitting device and the receiving device for the symmetric resonance type wireless power transmission scheme in which the two-dimensional rectangular helical type resonators are used as the transmitting device and the receiving device (that is, the wireless power transmission technology in which both of the transmitting device and the receiving device are configured with resonators). The resonator is made of a conductive line, such as aluminum or copper, and directly feeds power through the feeding point formed outside the helical structure of the resonator. If using such a feeding method, the resonator can be manufactured integrally with a transmitting circuit or a receiving circuit on the two-dimensional plane, like a PCB, due to the structural characteristic of the two-dimensional feeding. The resonator can also be easily manufactured in a film type.

Figure 7:
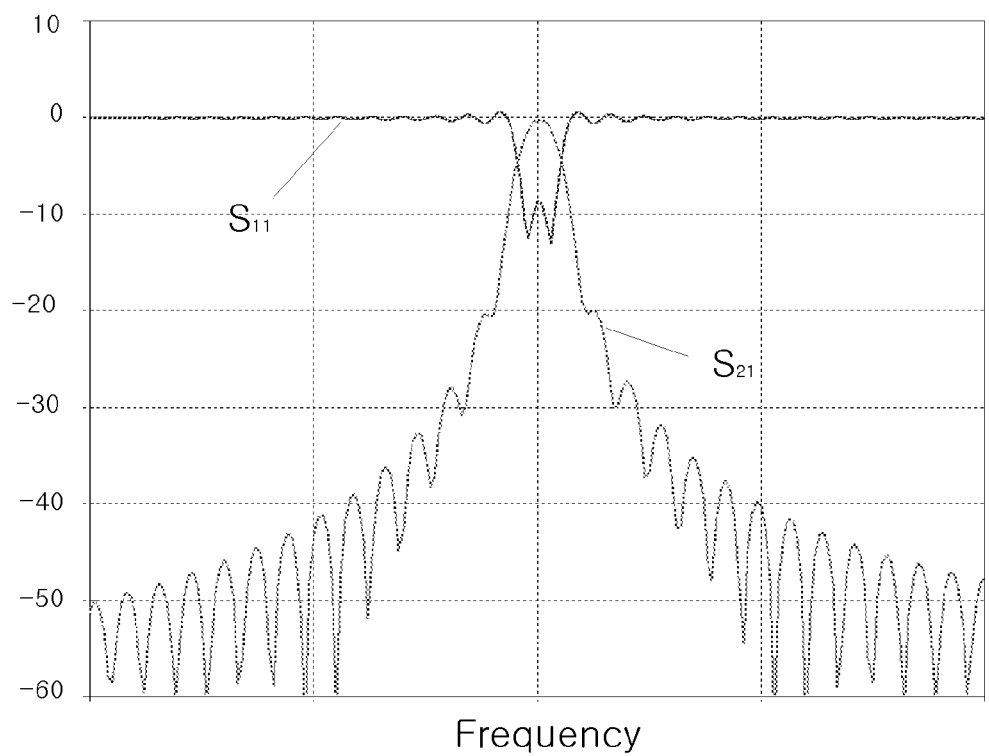
FIG. 7 shows an S parameter characteristic in an exemplary application to a symmetric resonance type transmitting device and receiving device in accordance with an embodiment of the present invention.

FIG. 7 shows performance when the distance (D in FIG. 4) between the transmitting device and the receiving device was approximately two times the width of the resonator, the square helical resonator was designed to have a width of approximately 60 cm, and the number of turns was five. In addition, as in the case of FIG. 4, the feeding point was installed at an edge portion close to the end point of the conductive line of the resonator. FIG. 7 shows an S parameter result in the "symmetric resonance type wireless power transmission" when the feeding point was connected through a 50-Ω cable. As can be seen from $S_{11}$ parameter, an amount of reflection at a resonant frequency was very small. In addition, as can be seen from $S_{12}$ parameter, 95% or more of RF power was transmitted.

Figure 8:
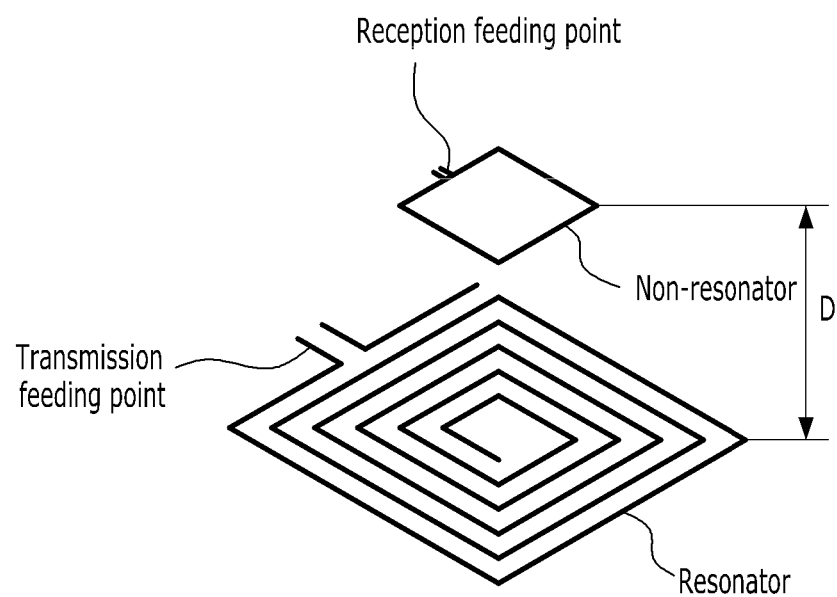
FIG. 8 is a configuration diagram of an asymmetric resonance type transmitter and receiver in accordance with an embodiment of the present invention.

FIG. 8 illustrates a case in which the direct feeding method in accordance with the embodiment of the present invention is applied to the "asymmetric resonance type wireless power transmission" structure (the wireless power transmission technology in which one of the transmitting device and the receiving device is implemented with the resonator and the other is implemented with the non-resonator). The structure of FIG. 8 includes a rectangular helical type resonator and a loop type non-resonator. It can be seen that this case also maintains the same characteristic as in the symmetric resonance type wireless power transmission structure. That is, in the case in which the distance between the non-resonator and the resonator is smaller than the threshold value, the feeding point moves to the center of the helical resonator. In the case in which the distance between the non-resonator and the resonator is larger than the threshold value, the feeding point moves to the end point of the conductive line spaced far from the center of the helical resonator. In this manner, the impedance matching is achieved. Since the current distribution of the resonator is close to the sinusoidal wave, the input impedance is decreased when the feeding point is set to the center of the resonator, and the input impedance is increased as the feeding point is farther from the center of the resonator.

Figure 9:
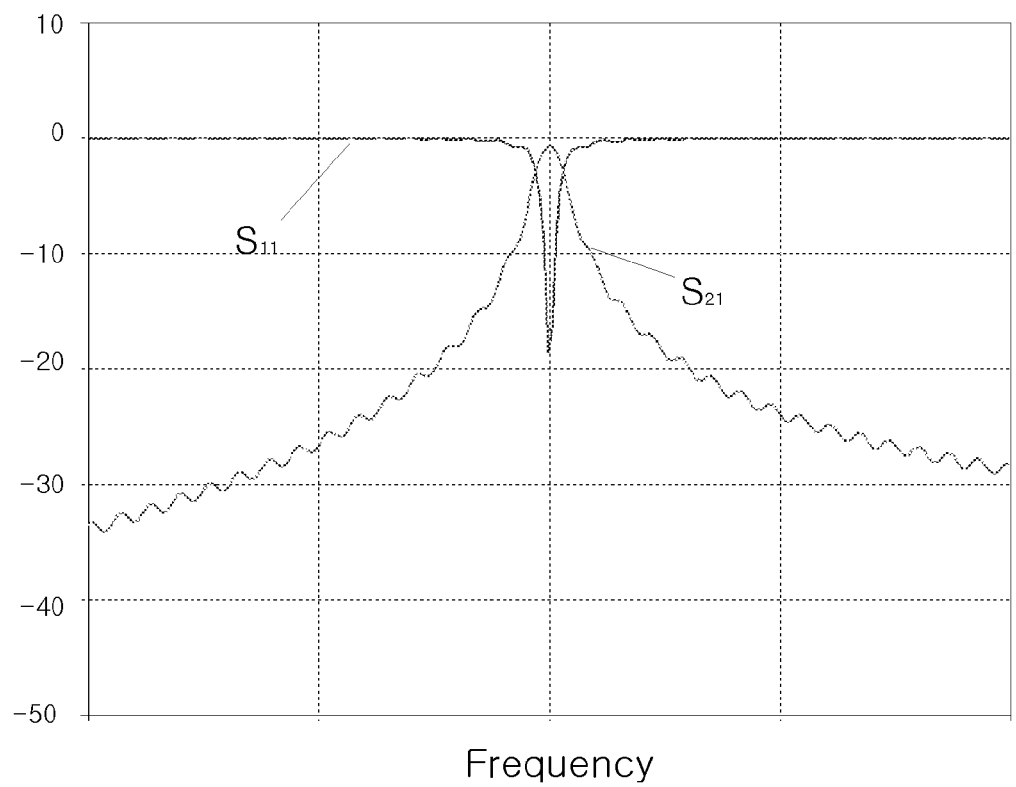
FIG. 9 shows an S parameter characteristic in an exemplary application to an asymmetric resonance type transmitting device and receiving device in accordance with an embodiment of the present invention.

FIG. 9 shows an S parameter characteristic in a real application to an "asymmetric resonance type wireless power transmission" transmitting device and receiving device. In this time, the distance between the transmitting device and the receiving device was approximately 1.5 times the width of the non-resonator, the width of the resonator was 60 cm, and the number of turns was five. In addition, as in the case of FIG. 8, the feeding point was installed in the outside of the helical structure, which was the end point of the conductive line of the resonator, and the feeding point was connected through a 50-Ω cable. FIG. 9 shows a very excellent impedance matching. As can be seen from $S_{11}$ parameter, an amount of reflection at a resonant frequency was very small. In addition, as can be seen from $S_{12}$ parameter, 90% or more of RF power was transmitted. The asymmetric resonance type wireless power transmission technology has a transmission distance shorter than the symmetric resonance type wireless power transmission technology, but the non-resonator can be manufactured in a small size. Therefore, it will be widely applied to the field of portable devices.

Figure 10A:
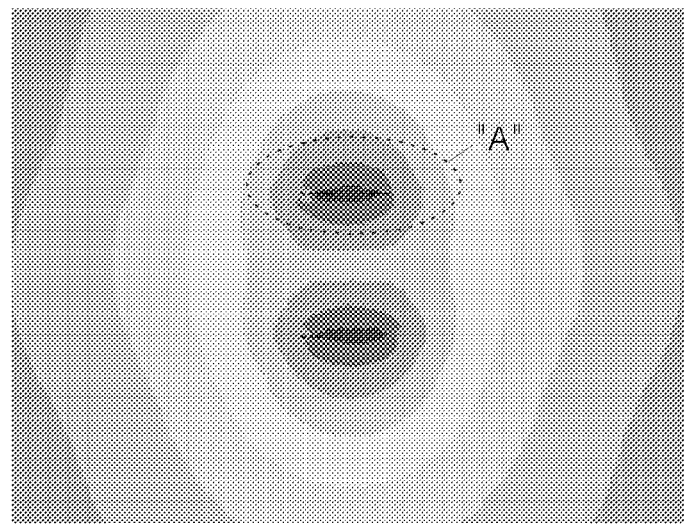
FIGS. 10A and 10B show distribution of an electric field around the symmetric and asymmetric resonance type receiving devices in accordance with the embodiment of the present invention.
Figure 10B:
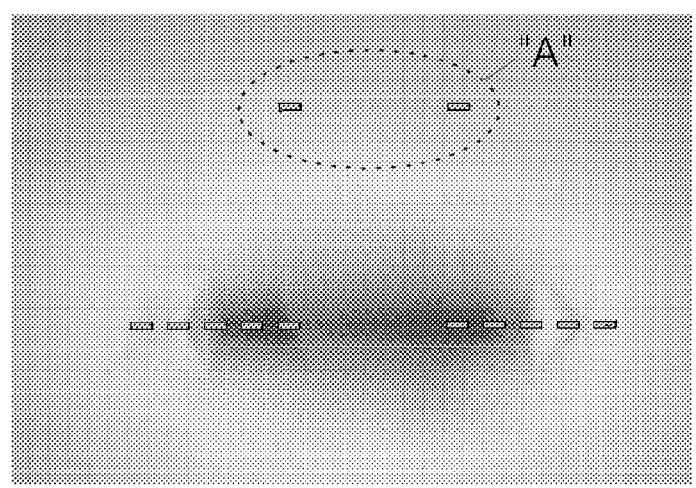

FIGS. 10A and 10B show distribution of an electric field around the symmetric and asymmetric resonance type wireless power transmission device (receiving device). The intensity of the electric field is very high at positions around the symmetric resonance type wireless power transmission device (receiving device) ("A" in FIG. 10A), whereas the intensity of the electric field is relatively low at positions around the asymmetric resonance type wireless power transmission device (receiving device). Such characteristics provide very important clues when intending to pass a guideline for influence on human body. The asymmetric resonance type structure is more advantageous than the symmetric resonance type structure in terms of improvement in shielding effect because the intensity of the electric field is low around the transmitting device (receiving device).

Figure 11A:
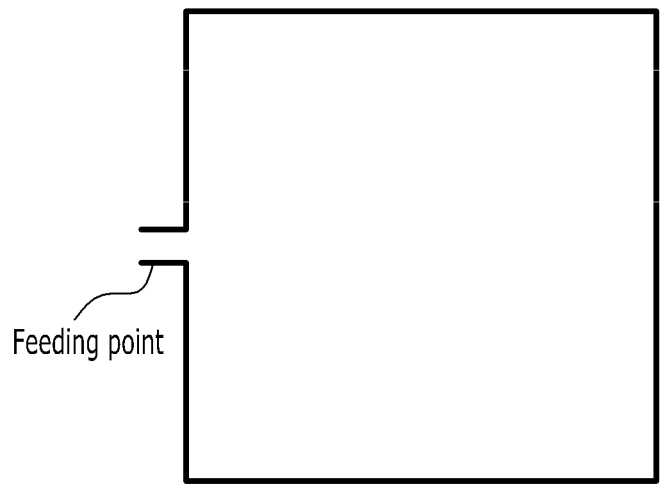
FIGS. 11A and 11B illustrate a rectangular helical type resonator and a resonator loop device whose number of turns is increased, in accordance with an embodiment of the present invention.
Figure 11B:
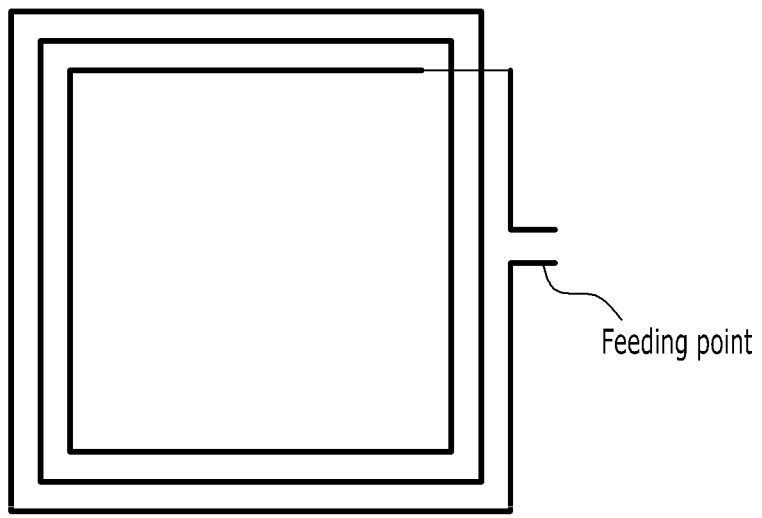
Figure 12A:
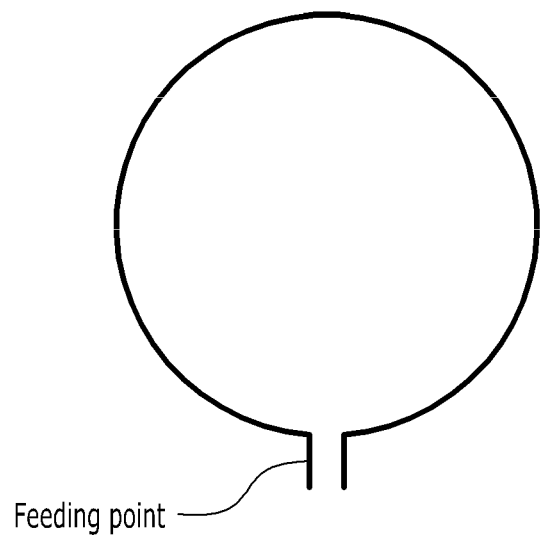
FIGS. 12A and 12B illustrate a circular helical type resonator and a resonator loop device whose number of turns is increased, in accordance with an embodiment of the present invention.
Figure 12B:
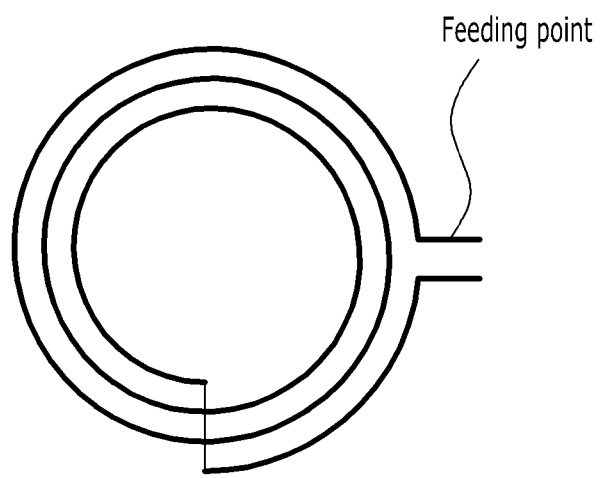

In addition, in the "asymmetric resonance type wireless power transmission", the distance between the transmitting device and the receiving device ("D" in FIG. 8) moves to the end point spaced far from the center point in order to enable a long-distance transmission as compared to a relative distance with respect to the width of the non-resonant. Furthermore, as illustrated in FIGS. 11B and 12B, it can be achieved by increasing the number of turns of the loop device, which is a non-resonator, above the threshold value. FIG. 11B illustrates the modification of the two-dimensional helical type resonator of FIG. 11A, in which the number of turns is increased, and FIG. 12B illustrates the modification of the two-dimensional circular helical type resonator of FIG. 12A, in which the number of turns is increased.

In the case in which the transmitting device and the receiving device are configured using the direct feeding method of installing the feeding point at the outside of the resonator in accordance with the embodiment of the present invention, a separate loop device (see FIG. 1) for impedance matching is not required, and a separate impedance matching circuit is not required. In addition, an installation space is significantly reduced. The symmetric resonance type wireless power transmission structure or the asymmetric resonance type wireless power transmission structure can be mounted on small portable devices, such as mobile phones, portable memories, smart phones, or i-phones, within a small space.

Figure 13A:
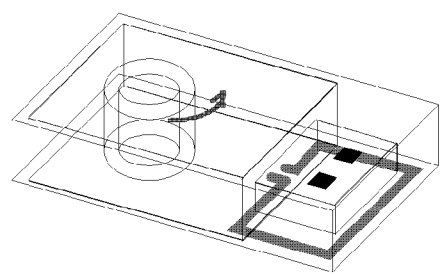
FIGS. 13A and 13B illustrate an example in which a receiving non-resonator is installed in a flash memory, in accordance with an embodiment of the present invention.
Figure 13B:
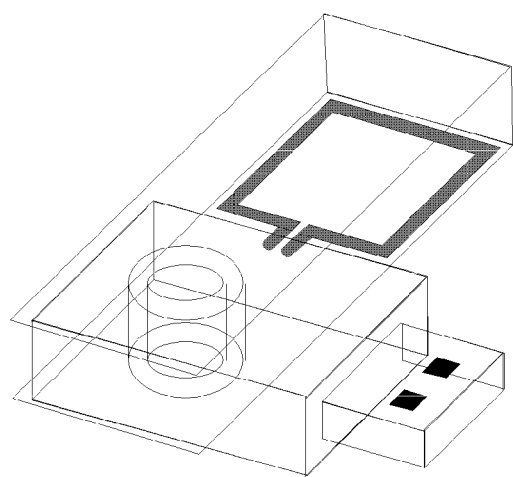

FIGS. 13A and 13B illustrate an example in which a receiving non-resonator is installed in a flash memory in order to implement the asymmetric resonance type wireless power transmission method using the direct feeding.

As illustrated, the non-resonance type receiving device is installed in a space separated from a main body when the cover of the flash memory is opened, and the cover is made of a nonconductor such as plastic. In this case, if the wireless power transmission is performed when the cover is opened, the influence from the main body can be minimized. The receiving device can be manufactured in a film type or a PCB type. In addition, the receiving device can be manufactured by coating a metal on the cover. Moreover, it can be configured by installing a conductive line integrally with the cover made of a nonconductor.

Figure 14A:
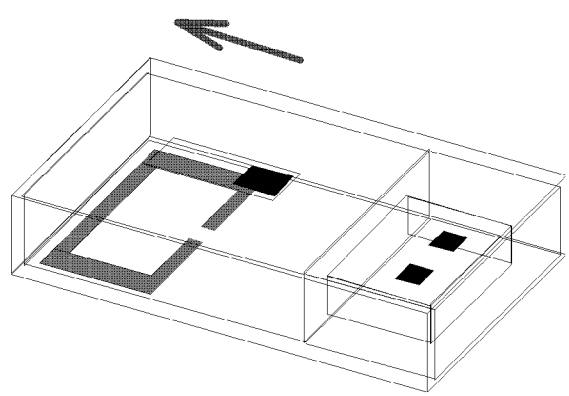
FIGS. 14A and 14B illustrate an example in which a receiving non-resonator is installed in a flash memory, in accordance with another embodiment of the present invention.
Figure 14B:
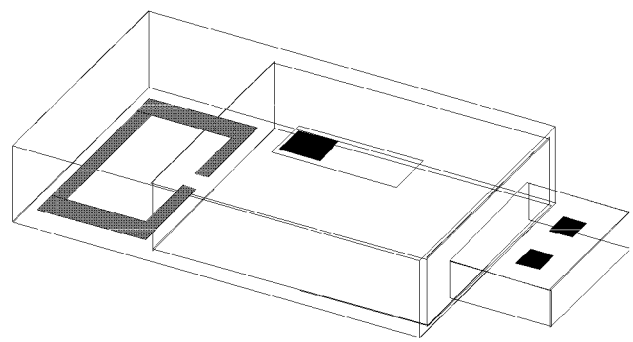

FIGS. 14A and 14B illustrate another example in which a receiving resonator is installed in a flash memory. While FIGS. 13A and 13B illustrate the structure which opens and closes the cover through rotation, FIGS. 14A and 14B illustrate the structure which pushes the cover upon use. Such a structure is installed in a space separated from the main body when the cover is opened. In this case, if the wireless power transmission is performed when the cover is opened, the influence from the main body can be minimized.

Figure 15A:
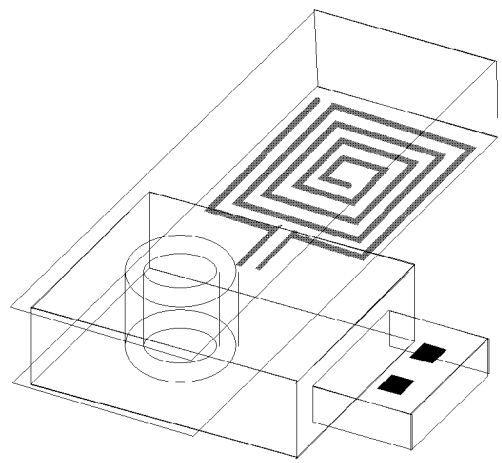
FIGS. 15A and 15B illustrate an example in which a receiving resonator is installed in a flash memory, in accordance with an embodiment of the present invention.
Figure 15B:
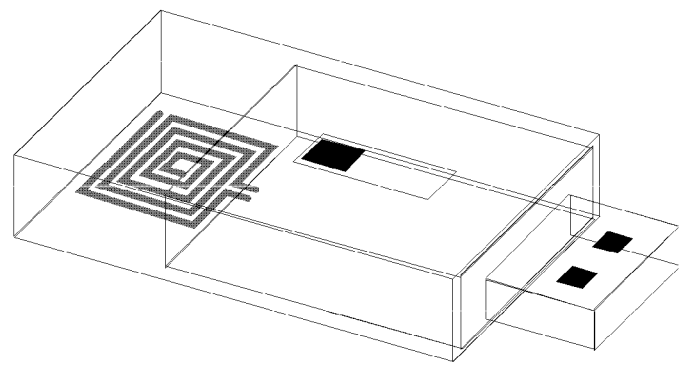

FIGS. 15A and 15B illustrate an example in which a resonator type receiving device is installed in a flash memory. It can be equally applied to the cases of FIGS. 14A and 14B in the above-mentioned manner. In the case in which the feeding structures of FIGS. 15A and 15B are used, the resonator can be manufactured very thinly in a PCB type or a film type and thus can be mounted on the flash memory.

Figure 16:
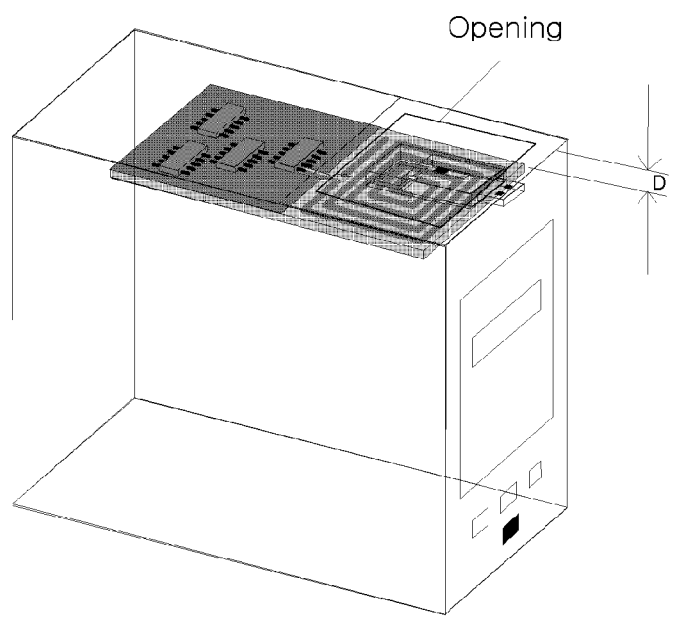
FIG. 16 illustrates an example of an RF energy transmission power which is implemented by installing a receiving non-resonator in a flash memory and installing a transmitting resonator in a computer main body, in accordance with an embodiment of the present invention.

FIG. 16 illustrates an installation example of the asymmetric resonance type wireless power transmission system in which a receiving unit (a receiving non-resonator) is installed in a flash memory and a transmitting unit (a transmitting resonator) is installed in a computer main body. An opening made of a nonconductor such as plastic or Teflon is installed in a case of a computer above a transmitting device of a power transmission device, the other portions of the case may be configured using iron, copper, aluminum. If the transmitting unit is installed at a position deeper than the computer case (when "D" is set to be large), the intensity of the electric field around the flash memory can be reduced during the wireless power transmission due to the characteristic shown in FIG. 10B. Thus, higher power transmission complying with the human body protection criterion can be achieved.

Figure 17:
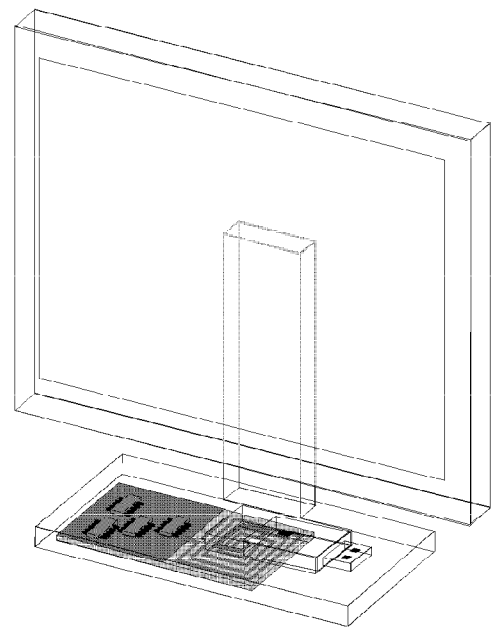
FIG. 17 illustrates an example of an RF energy transmission power which is implemented by installing a receiving non-resonator in a flash memory and installing a transmitting resonator in a computer monitor, in accordance with an embodiment of the present invention.

FIG. 17 illustrates an installation example of the asymmetric resonance type wireless power transmission system in which a receiving unit (a receiving non-resonator) is installed in a flash memory and a transmitting unit (a transmitting resonator) is installed in a computer monitor. In this embodiment, the flash memory is installed on a display support. In this case, since the monitor is placed on a desk, the system can be conveniently used.

Figure 18:
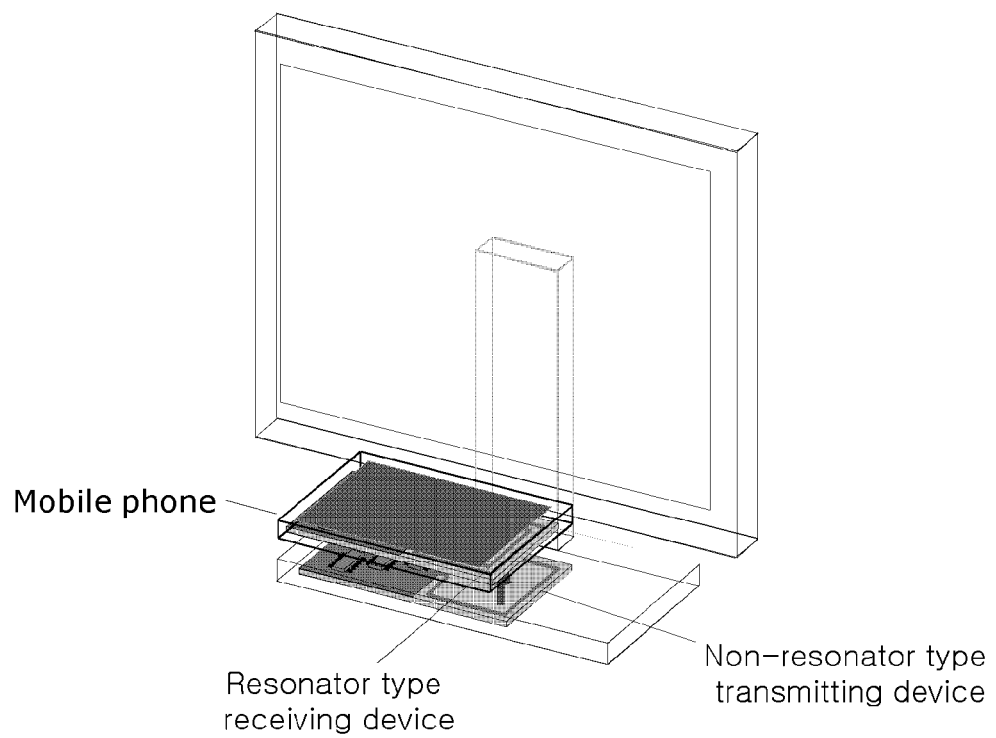
FIG. 18 illustrates an example of an RF energy transmission power which is implemented by installing a receiving resonator in a mobile phone and installing a transmitting non-resonator in a computer monitor, in accordance with an embodiment of the present invention.

FIG. 18 illustrates an installation example of the asymmetric resonance type wireless power transmission system in which a receiving unit (a receiving resonator) is installed in a mobile phone and a transmitting unit (a transmitting non-resonator) is installed in a computer monitor. In this embodiment, the mobile phone is placed on a display support.

Figure 19:
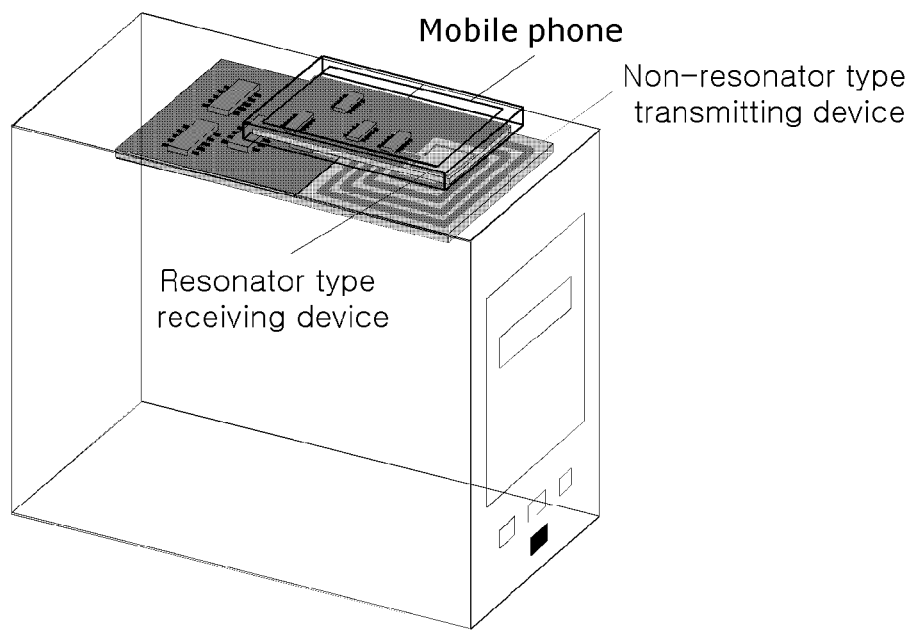
FIG. 19 illustrates an example of an RF energy transmission power which is implemented by installing a receiving non-resonator in a mobile phone and installing a transmitting resonator in a computer main body, in accordance with an embodiment of the present invention.

On the contrary, a non-resonator type receiving device may be installed in the mobile phone. In the case in which the non-resonator is installed in the mobile phone, the installation space may be small. Thus, it is very advantageous in miniaturizing the mobile phone. FIG. 19 illustrates an example in which a non-resonator type receiving device is installed in a mobile phone. A transmitting unit (a transmitting resonator) is installed inside a computer main body. In this case, the installation space of the mobile phone is reduced. As described above with reference to FIG. 16, the technology which reduces the influence on the human body can be provided.

Figure 20:
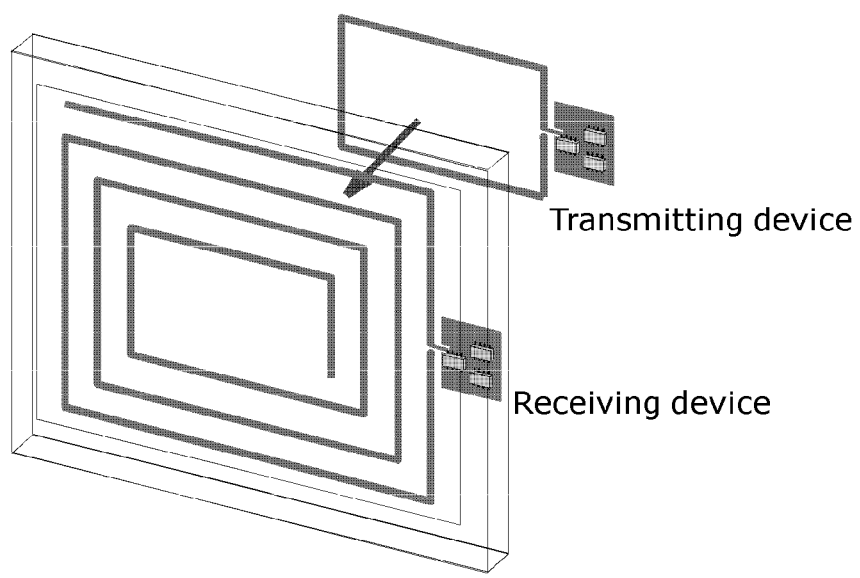
FIG. 20 illustrates an example of an RF energy transmission power which is implemented by installing a receiving resonator in a wall mount TV and installing a transmitting non-resonator on a wall, in accordance with an embodiment of the present invention.

FIG. 20 illustrates an example in which the asymmetric resonance type wireless power transmission technology is applied to a TV. In this embodiment, a receiving resonator may be installed in a wall mount TV, and a transmitting non-resonator may be installed on a wall. When the non-resonator is installed in the transmitting unit, the size of the transmitting unit can be reduced. Thus, the appearance may be improved. That is, since the TV main body is very large, the resonator type receiving device is easily installed. In the case in which the transmitting unit is installed in a separate space, it can be applied when the miniaturization is necessarily required. The symmetric resonance type wireless power transmission scheme can be implemented in the TV main body. In the case in which it is implemented in the symmetric resonance type, the transmitting unit can be manufactured more thinly, and power can be transmitted farther.

Figure 21A:
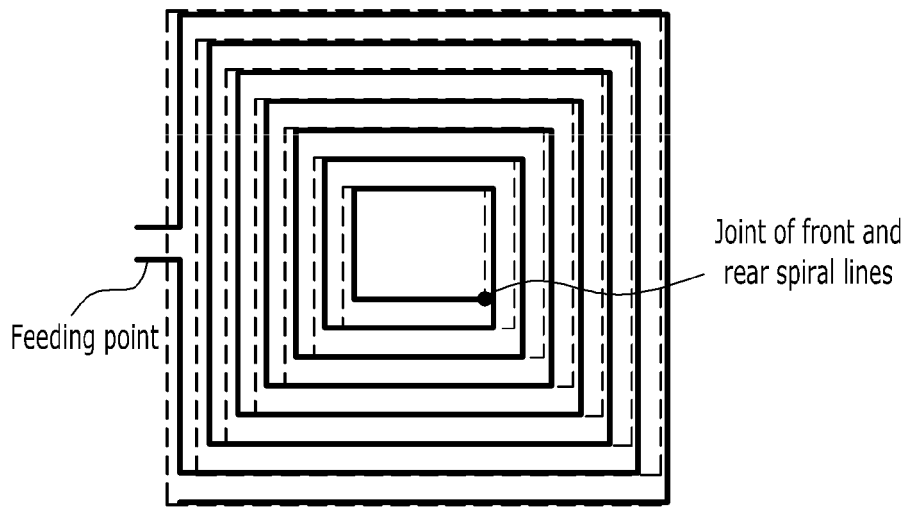
FIGS. 21A and 21B illustrate an example of two-dimensional rectangular and circular overlapping type resonators having a direct feeding structure, in accordance with an embodiment of the present invention.
Figure 21B:
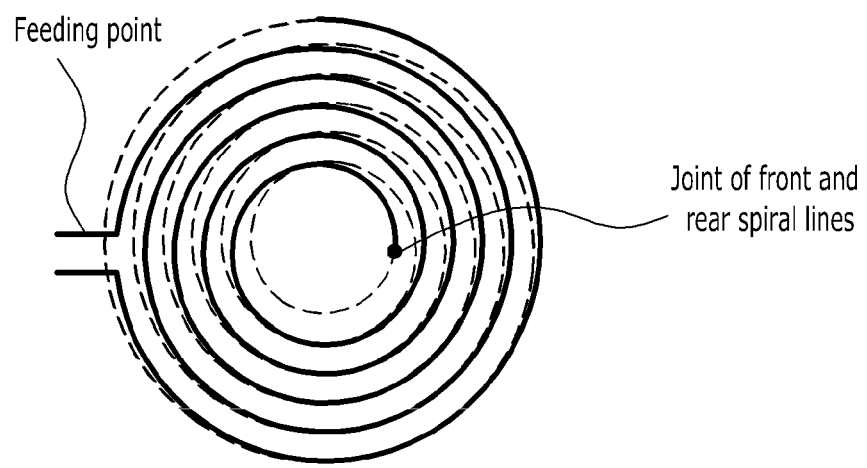

FIGS. 21A and 21B illustrate an example in which the direct feeding method is applied to an edge in a resonator device which is manufactured in a helical structure in layers in order to reduce a resonant frequency in the same size. The same characteristic can be obtained even though such a device is applied to a transmitting device and a receiving device of the "asymmetric resonance type wireless power transmission" or the "symmetric resonance type wireless power transmission." Although not illustrated, the feeding method is very useful for a case which is implemented with one transmitting device and a plurality of receiving devices.

In the exemplary embodiments of the present invention, power can be directly transmitted to the resonator, without separate impedance matching circuits. The resonator can be manufactured in an integrated type within a PCB having a two-dimensional plane. In addition, the resonator can be manufactured in a film type. Since the resonator can be manufactured thinly, the wireless power transmission device having a small installation space can be implemented.

While the present invention has been described with respect to the specific embodiments, it will be apparent to those skilled in the art that various changes and modifications may be made without departing from the spirit and scope of the invention as defined in the following claims.

What is claimed is:

1. A direct feeding apparatus for impedance matching of a wireless power transmission device, comprising:
   a helical type resonator formed of a conductive line; and
   a feeding unit formed on the helical type resonator, the feeding unit being configured to directly feed power to an outside region of the helical type resonator having a relatively small current value as compared to a center of the conductive line of the resonator without the impedance matching,
   wherein, when the power by the direct feeding apparatus is directly fed to a transmitting device, the transmitting device provides the power to a receiving device in a resonance type wireless power transmission scheme, without the impedance matching.

2. The direct feeding apparatus of claim 1, wherein the resonator comprises a two-dimensional rectangular helical type resonator.

3. The direct feeding apparatus of claim 1, wherein the resonator comprises a two-dimensional circular helical type resonator.

4. The direct feeding apparatus of claim 1, wherein the outside region is a region which does not include the center, when the conductive line of the resonator is equally divided by four.

5. A symmetric resonance type transmitter/receiver, wherein both of the transmitting device and the receiving device are configured with the direct feeding apparatus of claim 1, and the transmitting device and the receiving device are spaced apart from each other by a predetermined distance.

6. The symmetric resonance type transmitter/receiver of claim 5, wherein a feeding point is installed to be closer to an end point of the conductive line of the resonator as the distance between the transmitting device and the receiving device is larger than a threshold value, and the feeding point is installed to be farther from the end point of the conductive line of the resonator as the distance therebetween is smaller than the threshold value.

7. The symmetric resonance type transmitter/receiver of claim 5, wherein a resonator type receiving device is installed in a wall mount TV, and a resonator type transmitting device is installed on a wall.

8. An asymmetric resonance type transmitter/receiver, wherein
   one of the transmitting device and the receiving device is configured with the direct feeding apparatus of claim 1,
   the other is configured with a non-resonator including a direct feeding unit, and
   the transmitting device and the receiving device are spaced apart from each other by a predetermined distance.

9. The asymmetric resonance type transmitter/receiver of claim 8, wherein a feeding point is installed to be closer to an end point of the conductive line of the resonator as the distance between the transmitting device and the receiving device is larger than a threshold value, and the feeding point is installed to be farther from the end point of the conductive line of the resonator as the distance therebetween is smaller than the threshold value.

10. The asymmetric resonance type transmitter/receiver of claim 8, wherein the number of turns of a loop device being the non-resonator is increased as the predetermined distance is increased.

11. The asymmetric resonance type transmitter/receiver of claim 8, wherein the receiving device is provided in plurality, and the plurality of receiving devices are configured with a non-resonator.

12. The asymmetric resonance type transmitter/receiver of claim 8, wherein a non-resonator or resonator type receiving device is installed in a main body of a flash memory, and a separable cover is made of a nonconductor.

13. The asymmetric resonance type transmitter/receiver of claim 8, wherein a non-resonator type receiving device is installed in a flash memory, and a resonator type transmitting device is installed in a computer main body.

14. The asymmetric resonance type transmitter/receiver of claim 8, wherein a non-resonator type receiving device is installed in a flash memory, and a resonator type transmitting device is installed in a computer monitor.

15. The asymmetric resonance type transmitter/receiver of claim 8, wherein a resonator type receiving device is installed in a mobile phone, and a non-resonator type transmitting device is installed in a computer monitor.

16. The asymmetric resonance type transmitter/receiver of claim 8, wherein a non-resonator type receiving device is installed in a mobile phone, and a resonator type transmitting device is installed in a computer main body.

17. The asymmetric resonance type transmitter/receiver of claim 8, wherein a resonator type receiving device is installed in a wall mount TV, and a non-resonator type transmitting device is installed on a wall.

* * * * *